United States Patent
Lin et al.

(10) Patent No.: US 11,611,821 B1
(45) Date of Patent: Mar. 21, 2023

(54) EARPHONE WITH PROXIMITY SENSING FUNCTION

(71) Applicant: Luxsentek Microelectronics Corp., New Taipei (TW)

(72) Inventors: Chih-Wei Lin, New Taipei (TW); Sheng-Cheng Lee, New Taipei (TW); Wen-Sheng Lin, New Taipei (TW); Chen-Hua Hsi, New Taipei (TW)

(73) Assignee: LUXSENTEK MICROELECTRONICS CORP., New Taipei (TW)

( * ) Notice: Subject to any disclaimer, the term of this patent is extended or adjusted under 35 U.S.C. 154(b) by 25 days.

(21) Appl. No.: 17/502,950

(22) Filed: Oct. 15, 2021

(30) Foreign Application Priority Data

Aug. 25, 2021  (TW) ................ 110210047

(51) Int. Cl.
| | |
|---|---|
| *H04R 1/10* | (2006.01) |
| *H01L 31/173* | (2006.01) |
| *H01L 31/0203* | (2014.01) |
| *H04R 1/02* | (2006.01) |

(52) U.S. Cl.
CPC ....... *H04R 1/1041* (2013.01); *H01L 31/0203* (2013.01); *H01L 31/173* (2013.01); *H04R 1/1016* (2013.01)

(58) Field of Classification Search
CPC . H04R 1/1041; H04R 1/1016; H01L 31/0203; H01L 31/173
USPC .................................................. 381/74, 334
See application file for complete search history.

(56) References Cited

FOREIGN PATENT DOCUMENTS

WO    WO-2022019577 A1 *  1/2022

\* cited by examiner

*Primary Examiner* — Ammar T Hamid
(74) *Attorney, Agent, or Firm* — Muncy, Geissler, Olds & Lowe, P.C.

(57) ABSTRACT

This invention provides an earphone with a low light transmittance and a non-porous sensor cover. Covering the sensing cover on the proximity sensing device can reduce the interference of most of the ambient light and improve measurement accuracy.

10 Claims, 1 Drawing Sheet

EARPHONE WITH PROXIMITY SENSING FUNCTION

BACKGROUND OF THE INVENTION

1. Field of the Invention

The present invention relates to an earphone with a proximity sensor, in particular to an earphone with a low light transmittance and non-porous sensing cover covered the proximity sensor.

2. Description of the Prior Art

A Bluetooth earphone usually integrates a proximity sensor (PS) to detect wearing status to turn on/off the Bluetooth chip for reducing power loss.

In the sensing process, in addition to receiving the light reflected by the object to be measured, the proximity sensing device also receives ambient light to cause interference, which affects the measurement result of the sensor.

SUMMARY OF THE INVENTION

The present invention provides an earphone with a low light transmittance and non-porous sensing cover, which covers over a proximity sensing package structure, wherein the sensing cover can reduce the interference of most of the ambient light and improve the accuracy of the test, and the proximity sensing package structure still can sense the reflected light.

An earphone with proximity sensing function, comprising:

a housing with an accommodation space;

a sensing cover combined with the housing and to be coplanar with the housing, wherein the sensing cover is non-porous and has a thickness of 0.5-1 mm;

a proximity sensing package structure disposed inside the sensing cover; and an audio module and a control unit disposed in the accommodation space, wherein the proximity sensing package structure and the audio module are electrically connected with the control unit.

DESCRIPTION OF THE PREFERRED EMBODIMENTS

Below embodiments accompanied with drawings are used to explain the spirit of this invention to have better understanding for the person in this art, not used to limit the scope of this invention, which is defined by the claims of this patent application. The applicant emphasizes the element quantity and size are schematic only. Moreover, some parts might be omitted to skeletally represent this invention for conciseness.

Figure 1:
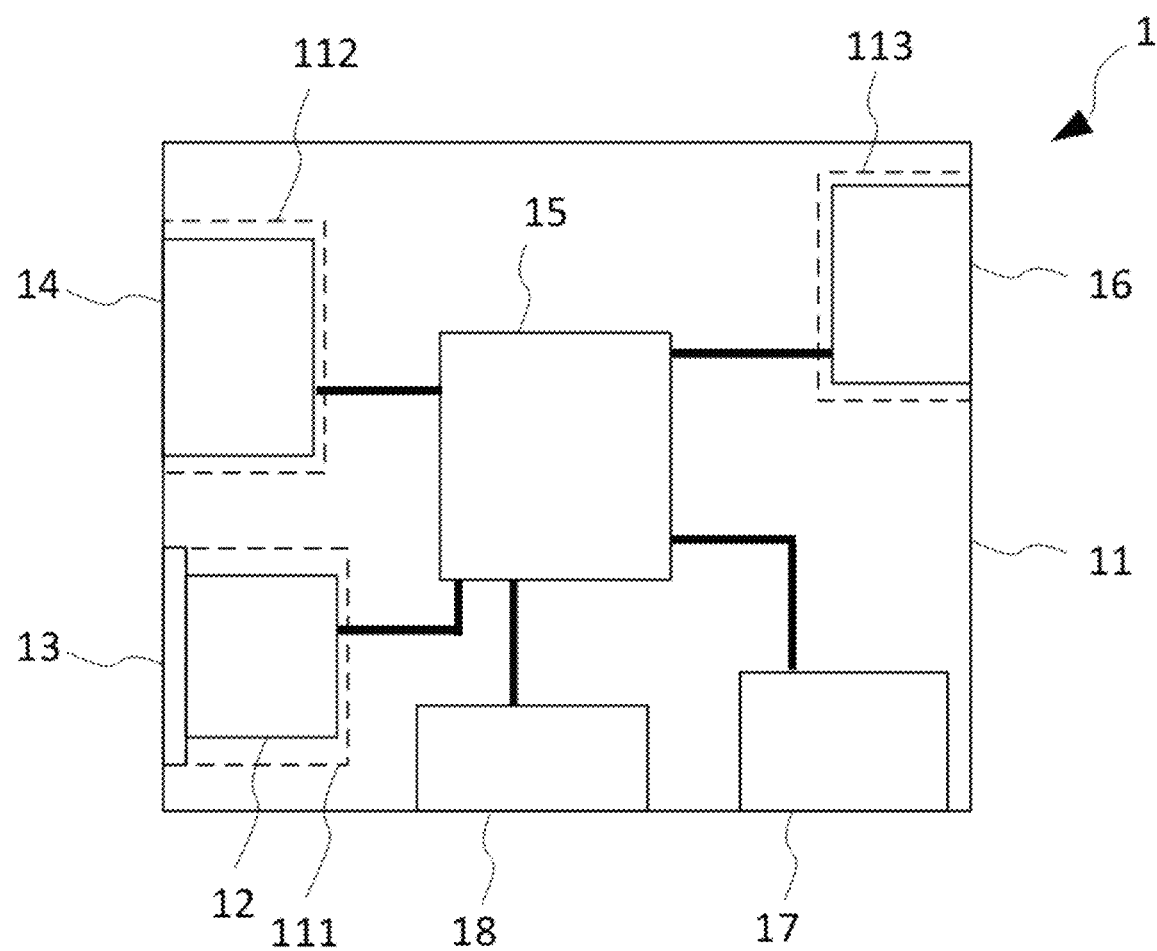
FIG. 1 is a cross-sectional view of the earphone of the present invention.

FIG. 1 shows a schematic layout in an accommodation space of a housing 11 of an earphone 1. The accommodating space is provided with a control unit 15, an audio module, and a proximity sensing package structure 12, wherein the proximity sensing package structure 12 is disposed in a sensing hole 111 inside the sensing cover 13 and is electrically connected to the control unit 15. The sensing cover 13 combines with the housing 11 and to be coplanar with the housing 11.

In an embodiment, the inner side of the housing 11 and/or the surface of the accommodating space are further covered with a black silicone layer to reduce the penetration rate of external ambient light through the housing 11.

The sensing cover 13 is non-porous, thin and low light transmittance for visible light. The thickness ranges from 0.5 to 1 mm, and the light transmittance is less than 5% for visible light. For example, the sensing cover 13 is made of polyoxymethylene, transparent epoxy resin or polyolefin.

The audio module includes an audio playing unit 14 (speaker) arranged in an audio hole 112, and a radio unit 16 (microphone) arranged in a radio hole 113, and the audio playing unit 14 and the radio unit 16 are electrically connected to the control unit 15 respectively.

The earphone 1 further comprises a communication unit 18 connected to the control unit 15, configured to communicate with an external electronic device by wire or wirelessly. In one embodiment, the communication unit 18 is controlled by the control unit 15 to transmit the sensed signal and/or the audio signal outputs from the radio unit 16 to the external electronic device, or the communication unit 18 is controlled by the control unit 15 to receive the audio signal from the external electronic device, and then transmits it to the audio playing unit 14 through the control unit 15. The earphone 1 further comprises a battery unit 17, which is configured to supply power to proximity-temperature sensor, the control unit 15, the communication unit 18, the audio module and the proximity sensing package structure 12.

Figure 2:
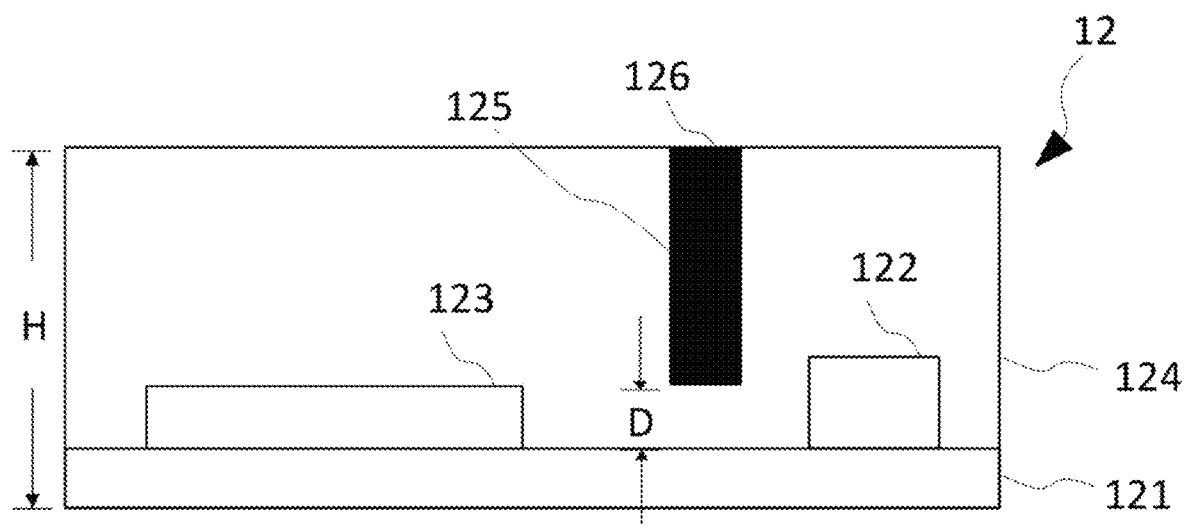
FIG. 2 is a side view of the proximity sensing package structure of the present invention.

FIG. 2 shows a schematical side view of the proximity sensing package structure 12. The packaging structure 12 comprises a light-emitting unit 122 is disposed on a first end of a surface of the substrate 121, and a photosensitive element 123 is disposed on a second end of the surface of the substrate 121. A transparent package housing 124 covers the substrate 121, the light-emitting unit 122, and the photosensitive element 123, wherein the transparent package housing 124 has a groove 125 between the first end (the light-emitting unit 122) and the second end (the photosensitive element 123), and the groove 125 extends forward to the substrate 121 and filled with opaque material 126. The opaque material 126 is used to avoid the light interference (crosstalk) between the light-emitting unit 122 and the photosensitive element 123.

In one embodiment, the surface of the substrate 121 is optionally covered with a black silicone layer or a material, this is designed to have a high light absorptivity to avoid/reduce the reflection.

The height H of the proximity sensing package structure 12 is between 0.5 mm and 0.7 mm. The width of the groove 125 is 80 μm~120 nm and a distance D between the groove 125 and the surface of the substrate 121 is 20 μm~50 μm. The distance D is small enough to avoid light propagating directly from the light-emitting unit 122 to the photosensitive element 123. The opaque material 126 is silicon wafer, metal, epoxy resin, resin-silicone glue or acrylic glue or the combination thereof. The material of the transparent package housing 124 is a low molecular weight epoxy resin, and its optical refractive index is between 1.55 and 1.65.

The light-emitting unit 122 can be a vertical-cavity surface-emitting laser (VCSEL) or a light-emitting diode (LED). The light-emitting unit 122 has a smaller light divergence angle to effectively reduce light scattering and propagation to reduce the crosstalk interference. The detection light emitted by the light emitting unit 122 can partially penetrate the sensing cover 13, and the reflected light reflected by the object to be measured can also penetrate the sensing side cover 13, so that the photosensitive element 123 can receive the reflected light. The light transmittance of the sensing cover 13 is low for visible light but high for sensing light.

The invention proposes an earphone with a non-porous and low light transmittance sensing cover, which can reduce the interference of ambient light and improve the accuracy of distance sensing. The non-porous design of the sensing cover can improve the dustproof, waterproof effect, design integrity, and design flexibility.

What is claimed is:

1. An earphone with proximity sensing function, comprising:
   a housing with an accommodation space;
   a sensing cover combined with the housing and to be coplanar with the housing, wherein the sensing cover is non-porous and has a thickness of 0.5-1 mm;
   a proximity sensing package structure disposed inside the sensing cover; and
   an audio module and a control unit disposed in the accommodation space, wherein the proximity sensing package structure and the audio module are electrically connected with the control unit.

2. The earphone according to claim 1, wherein the proximity sensing package structure comprises
   a light-emitting unit is disposed on a first end of a surface of a substrate;
   a photosensitive element is disposed on a second end of the surface of the substrate; and
   a transparent package housing covers the substrate, the light-emitting unit and the photosensitive element, wherein the transparent package housing has a groove between the first end and the second end, the groove extends toward the substrate and is filled with opaque material.

3. The earphone according to claim 2, wherein a width of the groove is 80 µm to 120 µm, and a distance of the groove to the surface of the substrate is 20 µm to 50 µm.

4. The earphone according to claim 2, wherein the light-emitting unit is a vertical-cavity surface-emitting laser or a light-emitting diode.

5. The earphone according to claim 2, wherein the surface of the substrate is covered with a black silicone layer.

6. The earphone according to claim 2, wherein the opaque material is silicon wafer, metal, epoxy resin, resin-silicone glue or acrylic glue or combination thereof.

7. The earphone according to claim 1, wherein a height of the proximity sensing package structure is 0.5-0.7 mm.

8. The earphone according to claim 1, wherein a light transmittance of the sensing cover is less than 5% for visual light.

9. The earphone according to claim 8, wherein the material of the sensing cover is polyoxymethylene, transparent epoxy resin or polyolefin.

10. The earphone according to claim 1, wherein a surface inside the housing is covered with a black silicone layer.

* * * * *